United States Patent
Kroeger

(10) Patent No.: US 6,584,128 B2
(45) Date of Patent: Jun. 24, 2003

(54) THERMOELECTRIC COOLER DRIVER UTILIZING UNIPOLAR PULSE WIDTH MODULATED SYNCHRONOUS RECTIFIERS

(75) Inventor: Richard Kroeger, Duluth, GA (US)

(73) Assignee: Scientific-Atlanta, Inc., Lawrenceville, GA (US)

(*) Notice: Subject to any disclaimer, the term of this patent is extended or adjusted under 35 U.S.C. 154(b) by 372 days.

(21) Appl. No.: 09/755,580

(22) Filed: Jan. 5, 2001

(65) Prior Publication Data

US 2002/0090012 A1 Jul. 11, 2002

(51) Int. Cl.[7] .................. H01S 3/042; F25B 21/02
(52) U.S. Cl. .................. 372/34; 62/3.2; 62/3.7
(58) Field of Search ............... 372/34; 62/3.2, 62/3.7

(56) References Cited

U.S. PATENT DOCUMENTS 5,936,987 A * 8/1999 Oshihi et al. .................. 372/38
6,205,790 B1 * 3/2001 Denkin et al. ................ 62/3.7
6,519,949 B1 * 2/2003 Wernlund et al.

OTHER PUBLICATIONS

Unitrode Application Note, UC1637/2637/3637 Switched Mode Controller for DC Motor Drive, Unitrode Corporation, 7 Continental Blvd., Merrimack, NH, 03054.*

Salerno, David, Unitrode Design Note, Closed Loop Temperature Regulation Using the UC3638 H–Bridge Motor Controller and a Thermoelectric Cooler, Unitrode Corporation, 7 Continental Blvd., Merrimack, NH, 03054.*

* cited by examiner

Primary Examiner—James Davie
(74) Attorney, Agent, or Firm—Kenneth M. Massaroni; Hubert J. Barnhardt, III; Shelley L. Couturier

(57) ABSTRACT

The preferred embodiment describes a regulating device (400) that regulates current flow through a thermoelectric cooler (TEC) (420) with higher power efficiency than conventional regulating methods. The regulating device includes a voltage controller (415) that receives an input voltage from a comparator (435) that has determined whether there has been a change in temperature surrounding a temperature sensitive device, such as a laser, by way of a thermistor (425). The controller (415) then controls two pulse width modulated (PWM) synchronous rectifiers (405, 410). The combination of the controller (415) and the synchronous rectifiers (405, 410) improves the power efficiency of the regulating device (400). Each PWM synchronous rectifier (405, 410) includes two field effect transistors (FETs) that supply substantially a constant current flow through the TEC (420) to either heat or cool a control surface (430).

20 Claims, 4 Drawing Sheets

THERMOELECTRIC COOLER DRIVER UTILIZING UNIPOLAR PULSE WIDTH MODULATED SYNCHRONOUS RECTIFIERS

FIELD OF THE INVENTION

This invention relates generally to broadband communications, such as cable television systems, and more specifically to optical devices, such as fiber transmitters, within the cable television systems that utilize thermoelectric coolers.

BACKGROUND OF THE INVENTION

A communication system 100, such as a two-way cable television system, is depicted in FIG. 1. The communication system 100 includes headend equipment 105 for generating forward signals that are transmitted in the forward, or downstream, direction along a communication medium, such as a fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system split off portions of the forward signals for provision to subscriber equipment 135, such as set top terminals, computers, and televisions. In a two-way system, the subscriber equipment 135 can also generate reverse signals that are transmitted upstream, amplified by any distribution amplifiers 125, converted to optical signals, and provided to the headend equipment 105.

Operators are continuing to revolutionize the conventional network architecture as depicted in FIG. 1, and more recently, have begun to consolidate headends within the network and extend longer fiber optic cable runs as shown in FIG. 2. A network deploying more fiber optic cable than conventional coaxial cable allows a centralized super headend 205 to be shared with sites that may be hundreds of miles away, thereby eliminating several headends 105 throughout the conventional network 100. Emanating from the consolidated headend 205 in all directions are hubs 210 that serve several different sites within the network 200. Fiber equipment enclosed in the hubs 210 distribute the optical signals generated from the headend 205 further through the network 200 until conversion of the optical signals to electrical signals by an optical node 215. The electrical signals are then amplified by an amplifier 220 and continue downstream for the final transmission to the subscriber.

The fiber equipment included in the hubs 210 is generally optical transmitters and receivers, which are contained in racks. Generally, the fiber equipment consumes much of the hub space; therefore, internal airflow is closely monitored to ensure that the fiber equipment does not overheat. In addition to experiencing the heat generated by the fiber equipment, the hubs may become extremely hot in the summer months and extremely cold in the winter months, even though the hubs are traditionally enclosed and somewhat environmentally controlled. As a result, there are external fans for dissipating the heat away from the fiber equipment and cooling devices, such as thermoelectric coolers, designed within the fiber equipment that are used to electrically cool.

By way of example, a thermoelectric cooler (TEC) is used in the optical transmitter to assist in cooling and heating the laser within the transmitter. It is known that controlling the laser temperature to within the standard temperature rating of the laser significantly enhances signal quality of the optical transmission lasers. A laser may be physically attached to the top of the TEC and the whole package may then be hermetically sealed and placed on a heatsink, such as a metal chassis. Functionally, the TEC utilizes current flow to either cool or heat the laser package depending on the environment surrounding the laser. To cool the laser, which is generally the case, current will flow in one direction through the TEC. To heat the laser in the cases of extreme cold, the current will flow in the opposite direction. The amount of cooling or heating is controlled by the magnitude of the current flowing through the TEC.

Conventionally, switching techniques, linear regulation, or a bridge topology can be employed to control the magnitude and direction of current flow through the TEC. Additional details of the conventional regulation of current flow through the TEC are set forth, for example, in a design note by Unitrode DN-76, the teachings of which are incorporated herein by reference.

One conventional example of a device that controls the current through a TEC is depicted in FIG. 3 and further discussed in the Unitrode DN-76 publication, which describes the use of a bridge topology. More specifically, a thermistor 305 is used to detect any temperature fluctuations, and the resulting change in voltage is provided to a pulse width modulated (PWM) controller 310, which is powered by a power supply 315. A bridge topology 320, that includes four field effect transistors (FETs) (not shown), and an LC filter 325 process the signal from the PWM controller 310 to regulate the direction and magnitude of current flow into the TEC 330. Depending upon the magnitude and direction of the current flow, the TEC 330 will either heat or cool the control surface 335. A heatsink 340, such as a metal chassis, absorbs the heat from the surrounding components and the heat generated from the TEC 330 and transfers it away from the control surface 335. An external fan 345 dissipates the transferred heat into the surroundings.

Utilizing the conventional methods, such as a bridge topology 320, of regulating the TEC 330 consumes significant power. More specifically, the device to be cooled consumes power, and this power consumption in turn heats the surrounding area. As a result, additional cooling is often necessary. Thus, what is required is a method of regulating the current flow through a TEC 330 to maximize the power efficiency of the overall device in which it is included, and in addition, to minimize the heat generation that will adversely affect the surrounding components.

DETAILED DESCRIPTION OF A PREFERRED EMBODIMENT

As mentioned briefly in the Background of the Invention, thermoelectric coolers (TECs) are used within fiber equipment, such as optical transmitters, to heat or cool a control surface. The control surface may, for example, then regulate the temperature around a temperature sensitive device, such as a laser. Conventional methods of regulating the current flow through the TEC, however, consume a significant portion of the current designed within the fiber equipment, such as the optical transmitter. In addition, conventional methods heat the surrounding components and thereby do not maximize the power efficiency since the amount of heat that must be dissipated can be increased. Fiber optic components, such as the optical transmitters and receivers, are often physically located within hubs that provide very limited environmental protection and, generally, will not prevent overheating or extreme cooling of the components. In such cases, the internal components may fail, potentially causing device malfunctions and, in communication systems, interrupting service to a substantial number of subscribers.

Figure 1:
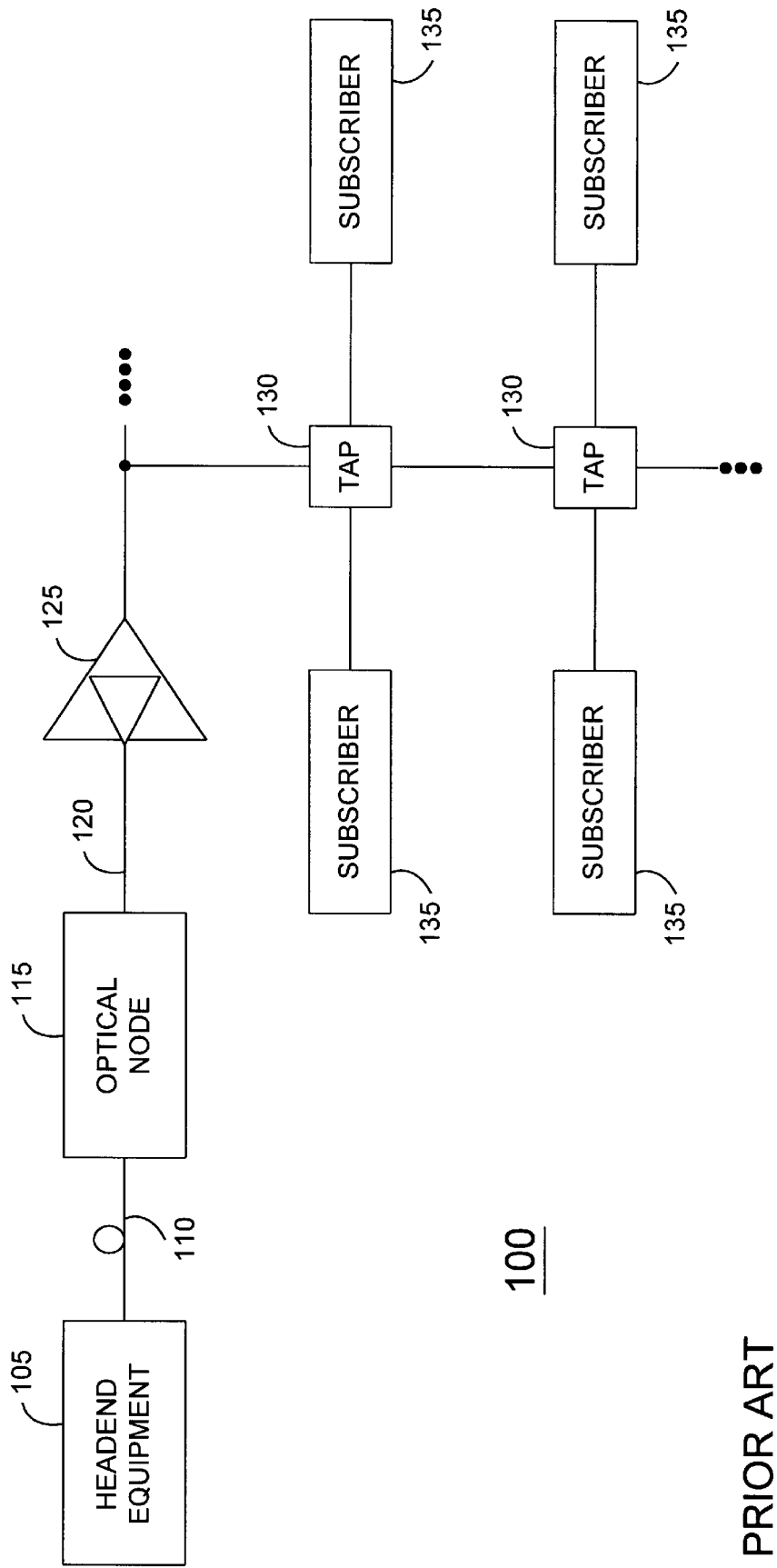
FIG. 1 is a block diagram of a conventional communication system, such as a cable television system.
Figure 2:
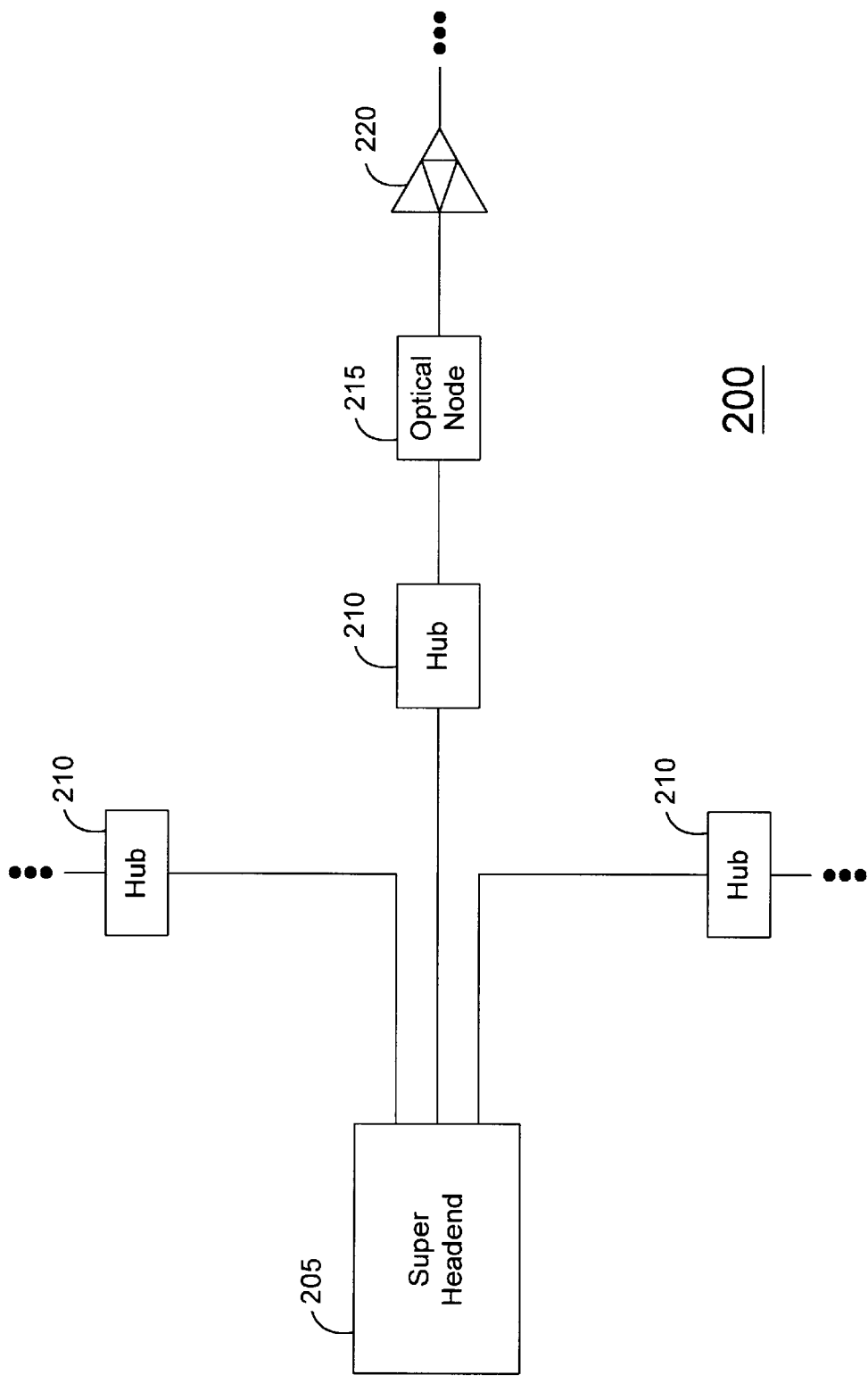
FIG. 2 is a block diagram of a conventional communication system, such as a cable television system, utilizing fiber optic cable from a super headend to hubs.
Figure 3:
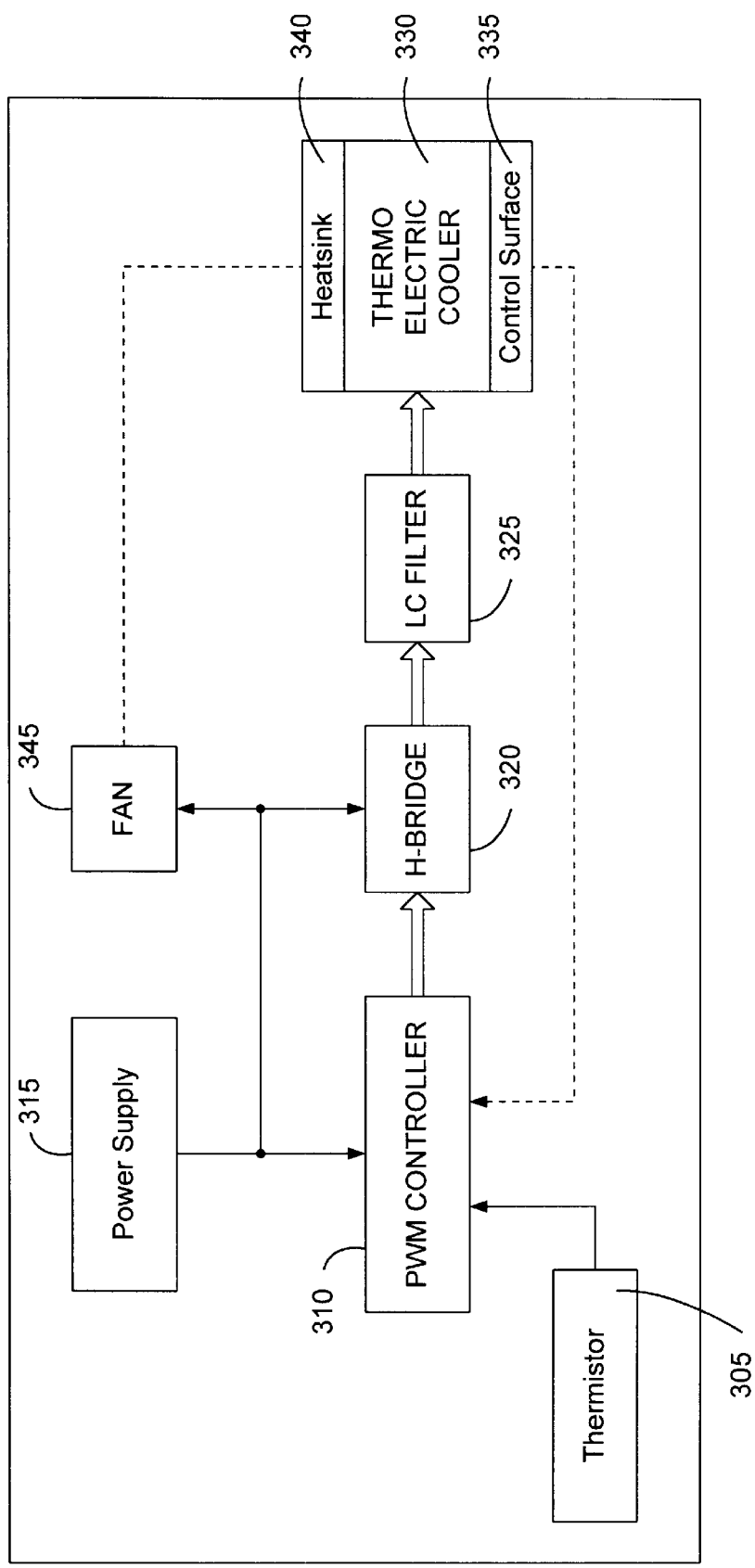
FIG. 3 is a block diagram of a conventional temperature controller using an H-bridge to regulate a thermoelectric cooler device.
Figure 4:
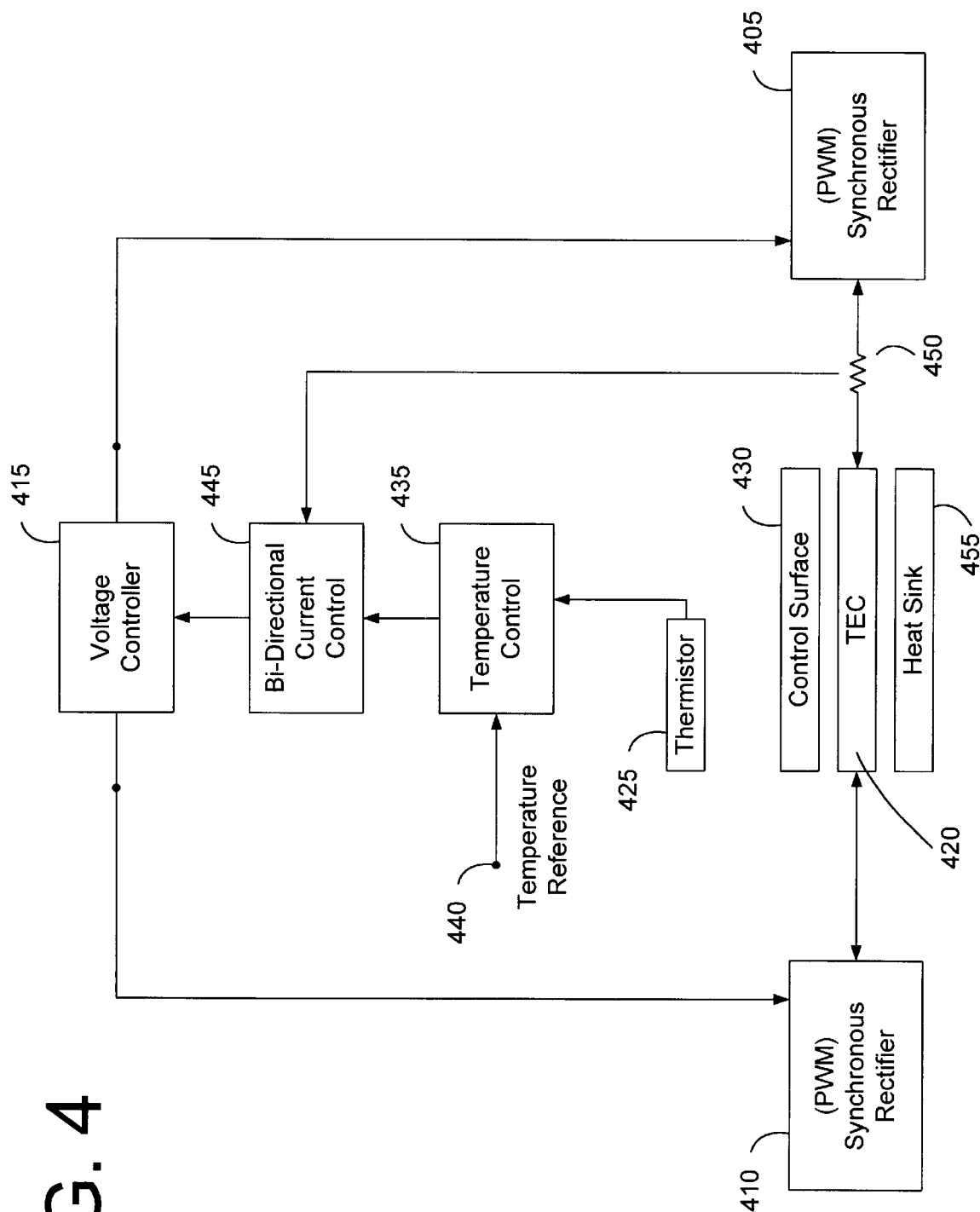
FIG. 4 is a block diagram of a thermoelectric cooler utilizing unipolar pulse width modulated (PWM) synchronous rectification in accordance with the present invention.

In accordance with the present invention, a thermoelectric cooler that utilizes pulse width modulated (PWM) synchronous rectifiers and additional circuitry is depicted in FIG. 4. This preferred embodiment of the present invention utilizes synchronous rectifier circuits 405, 410 that minimize any bridge cross-conduction problems that may be experienced by using the conventional bridge topologies such as represented in FIG. 3. Another advantageous feature of the present invention is unipolar voltage control of the synchronous rectifiers 405, 410 by a voltage controller 415 that allows bi-directional current flow and commands to the synchronous rectifiers 405, 410. The combination of the controller 415 and the two PWM synchronous rectifiers 405, 410 results in significant power efficiency in comparison to the previous conventional methods of regulating current through a TEC. This is becoming more critical as the fiber equipment plays a more important role in the revolution of broadband service networks.

Referring to FIG. 4, a thermistor 425 or other type of temperature sensing device is used to detect any temperature fluctuations around a control surface 430, which is located near or thermally connected to a temperature sensitive device, such as a fiber optic laser. It will be appreciated that the thermistor 425 should be located in close proximity to the control surface 430 to provide more accurate temperature readings. For example, a control surface 430, such as a metal plate, may be enclosed in a hermetically sealed package with the TEC 420, and the thermistor 425 can be located in close proximity; however, the thermistor 425 can alternatively be included within the sealed package. If necessary, such as when an electrical device has severe space constraints, the thermistor 425 could even be located further from the control surface 430, as long as the extent to which the temperature at the more distant location differs from the temperature at locations near the control surface 430 is known so that measurement compensation can be provided.

A temperature control circuit 435 then processes the output of the thermistor 425 and determines if there are any fluctuations in temperature by referencing a resistive temperature reference 440, which is indicative of a desired temperature, and the thermistor output, which is indicative of the temperature at the location of the thermistor 425, and compares the two outputs. The compared output voltage signal of the temperature controller circuit 435 is then provided to a bi-directional current control 445, which can, for example, consist of operational amplifiers.

The bi-directional current controller 445 compares the output voltage signal provided by the temperature control circuit 435 with a current monitor signal, which is a voltage signal that is provided by a current monitor 450. The current monitor 450 is located along a common electrical path with the TEC 420. The configuration of the current controller 445, the voltage controller 415 and the current monitor 450 act as a closed loop that constantly determines any fluctuation of temperature from the temperature control circuit 435, compares the output voltage signal of the temperature control circuit 435 with the current monitor signal from the current monitor 450, determines the amount of correction required to equate the two voltage values, and then continues to monitor the progress of correction. The amount of correction required to equate the two voltage values is a ratio signal that is indicative of the amount of cooling or heating required. Also included in the closed loop cycle, the thermistor 425 detects the cooling or heating, and provides a new output signal, indicative of the stabilizing temperature, to the temperature control circuit 435. When the two voltage signals are again equal, the temperature around the control surface 430 is considered stable.

In both heating and cooling functions, the amount of current increases through the TEC 420; however, the direction flow differs. More specifically, the amount of current, in accordance with the ratio signal, acts as a thermostat to control the amount of heating or cooling. The ratios, however, may not be the same for heating as for cooling. Depending upon the device used, if the heating and cooling functionality does not heat or cool symmetrically, the current controller 445 can be programmed with the specifications appropriate for that particular device.

The voltage controller 415, which may be included in an integrated circuit package, receives the ratio signal from the current controller 445 and additionally determines whether the output voltage signal indicates an increase in temperature or a decrease in temperature. The voltage controller 415 then provides both a first and second ratio signal to the two synchronous rectifiers 405, 410, wherein depending upon the ratio signal supplied to each synchronous rectifier, one of the synchronous rectifiers will source current by way of increasing the voltage of the first ratio signal, and one will sink current by way of decreasing the voltage of the second ratio signal. It will be appreciated that whether cooling or heating takes place depends upon which synchronous rectifier is sourcing the current and which is sinking the current, and the amount of the heating or cooling is determined by the magnitude of the current that passes through the TEC.

If there is no temperature change around the thermistor 425, the output voltage signal and the current monitor signal are equal. The controller 415 receives the equated signal and outputs a first and second ratio signal that are equal; therefore, there is no sinking or sourcing of current. The controller 415 continues to receive signals until such time as there is a change in temperature. If the temperature control circuit 435 indicates an increase in voltage, which is indicative of a temperature increase around the control surface 430, the current controller 445 determines and provides the ratio signal to the voltage controller 415. The voltage controller 415 then activates both synchronous rectifiers 405, 410 by supplying the first and second ratio signals, with the first ratio signal sourcing current through the TEC 420 to cool. If the temperature control circuit 435 indicates a decrease in voltage, which is indicative of a temperature decrease around the control surface 430, the current controller 445 determines the ratio signal that represents the magnitude of current required to heat the control surface 430, and the controller 415 activates the synchronous rectifiers 405, 410 by supplying the first and second ratio signals, with the second ratio signal sourcing current through the TEC 420 to heat.

By way of example, if the temperature has increased a minimal amount, but still requires cooling, the ratio signal may be a small value such as 0.2. The first ratio signal will have a slightly higher voltage value than the second ratio signal and, as a result, will source current from synchronous rectifier 405 that may, for example, result in the magnitude of current being 0.1 ampere (A). If, however, the temperature has increased dramatically, the first ratio signal may have a substantial increase in voltage than the second ratio signal and may, for example, increase the current flow to 0.4A, thereby effectively increasing the cooling thermostat capabilities. The current monitor 450 provides the changing current monitor signal to the current controller 445 and the first and second ratio signals will change in accordance with the current monitor signal. Similarly, the above example can be used if the temperature has decreased, in which case current is supplied through the TEC 420 from the opposing end; in other words, sourcing current through synchronous rectifier 410 provides the heating function.

A direct current (DC) voltage (not shown), such as a 5 VDC supply, is supplied to each synchronous rectifier 405, 410. Included in each synchronous rectifier 405, 410 are field effect transistor (FET) devices (not shown) that represent a half bridge topology associated with each synchronous rectifier 405, 410. It will be appreciated, however, that the FET devices can be located in the signal path directly after the synchronous rectifiers 405, 410. Referring specifically to synchronous rectifier 405, two internal FETs, operating as a half bridge, switch "on" and "off". Specifically, when one FET is "on", the other FET is "off", which substantially results in a continuous supply of current through the TEC 420 to maximize the power efficiency. Similarly, when synchronous rectifier 410 is sourcing current, the output current is provided by two FETs resulting in a continuous supply of current. It will be appreciated that there is some switching time associated with the FETs that is allowed, but essentially, the current is considered a continuous supply when the outputs of each FET are combined onto a common signal path.

In addition to the TEC 420, a heat sink 455 may be used for further dissipating heat. The heat sink 455 can be included in the sealed package or in thermal contact with the package. This allows the heat to transfer away from the control surface 430, through the heat sink 455, and to dissipate in the open-air portion of the fiber equipment. For increased protection, external fans (not shown) in and around the fiber equipment can still be used to further encourage heat dissipation away from the equipment and into the surrounding air.

In summary, a voltage controller 415 driving two PWM synchronous rectifiers 405, 410 is capable of regulating the current flow through a TEC 420, in either the heating or cooling direction, with a significant improvement in power efficiency of the overall fiber equipment and less heating of surrounding components. These advantages allow the fiber equipment, such as optical transmitters, to operate in hotter or colder environments without risk of overheating or freezing, which may result in product failure or signal degradation to the subscriber.

What is claimed is:

1. A temperature regulator for regulating temperature, comprising:
   detecting means for detecting a temperature;
   a comparator coupled to the detecting means for comparing the temperature to a temperature reference, wherein the comparator provides an output voltage signal;
   a controller coupled to the comparator for receiving the output voltage signal, and for providing a first ratio signal dependent upon the output voltage signal at a first output port of the controller;
   a first synchronous rectifier coupled to the first output port of the controller for receiving the first ratio signal, and for providing an output signal in accordance with the first ratio signal; and
   means for regulating temperature on a control surface, wherein the temperature regulating means receives the output signal from the first synchronous rectifier and regulates the temperature in accordance with the output signal.

2. The temperature regulator of claim 1, further comprising:
   a current monitor for measuring the output signal provided by the first synchronous rectifier to generate a current monitor signal, wherein the controller additionally receives the current monitor signal and provides the first ratio signal in accordance therewith.

3. The temperature regulator of claim 1, wherein the temperature reference is indicative of a desired temperature, and wherein the controller further comprises:
   a second output port; and
   a circuit within the controller for determining when the output voltage signal indicates that the temperature is above the desired temperature and when the output voltage signal indicates that the temperature is below the desired temperature.

4. The temperature regulator of claim 3, further comprising:
   a second synchronous rectifier coupled to the second output port of the controller, wherein the controller generates a second ratio signal in accordance with the output voltage signal, and the second ratio signal is provided to the second synchronous rectifier.

5. The temperature regulator of claim 4, wherein the controller adjusts voltage levels of the first and second ratio signals depending upon the output voltage signal provided by the comparator.

6. The temperature regulator of claim 5, wherein, when the temperature has increased above the desired temperature, the controller decreases the voltage level of the first ratio signal and increases the voltage level of the second ratio signal and, when the temperature has decreased below the desired temperature, the controller increases the voltage level of the first ratio signal and decreases the voltage level of the second ratio signal.

7. The temperature regulator of claim 1, wherein the first synchronous rectifier provides the output signal to the temperature regulating means and thereby decreases the temperature across the temperature regulating means in accordance with the output signal.

8. The temperature regulator of claim 4, wherein the second synchronous rectifier provides the output signal to the temperature regulating means and thereby increases the temperature across the temperature regulating means in accordance with the output signal.

9. The temperature regulator of claim 1, wherein the temperature regulating means is a thermoelectric cooler.

10. A fiber optic device for converting electrical signals to optical signals, and for transmitting the optical signals, which include information, within a communication system, the fiber optic device comprising:
    an input for receiving electrical signals;
    a fiber optic laser for transmitting the optical signals; and a temperature regulator for regulating temperature within the fiber optic device, the temperature regulator comprising:

detecting means for detecting a temperature;

a comparator coupled to the detecting means for comparing the temperature to a temperature reference, wherein the comparator provides an output voltage signal;

a controller coupled to the comparator for receiving the output voltage signal, and for providing a first ratio signal dependent upon the output voltage signal at a first output port of the controller;

a first synchronous rectifier coupled to the first output port of the controller for receiving the first ratio signal, and for providing an output signal in accordance with the first ratio signal; and means for regulating temperature on a control surface, wherein the temperature regulating means receives the output signal from the first synchronous rectifier and regulates the temperature in accordance with the output signal.

11. The fiber optic device of claim 10, wherein the temperature reference is indicative of a desired temperature, and wherein the controller further comprises:

a second output port; and a circuit within the controller for determining when the output voltage signal indicates that the temperature is above the desired temperature and when the output voltage signal indicates that the temperature is below the desired temperature.

12. The fiber optic device of claim 11, wherein the temperature regulator further comprises:

a second synchronous rectifier coupled to the second output port of the controller, wherein the controller generates a second ratio signal in accordance with the output voltage signal, and the second ratio signal is provided to the second synchronous rectifier.

13. The fiber optic device of claim 12, wherein the temperature regulator further comprises:

a current monitor for measuring the output signal provided by the first synchronous rectifier to generate a current monitor signal, wherein the controller additionally receives the current monitor signal and provides the first ratio signal and the second ratio signal in accordance therewith.

14. The fiber optic device of claim 12, wherein the controller adjusts voltage levels of the first and second ratio signals depending upon the output voltage signal provided by the comparator.

15. The fiber optic device of claim 14, wherein, when the temperature has increased above the desired temperature, the controller decreases the voltage level of the first ratio signal and increases the voltage level of the second ratio signal and, when the temperature has decreased below the desired temperature, the controller increases the voltage level of the first ratio signal and decreases the voltage level of the second ratio signal.

16. The fiber optic device of claim 10, wherein the first synchronous rectifier provides the output signal to the temperature regulating means and thereby decreases the temperature across the temperature regulating means in accordance with the output signal.

17. The fiber optic device of claim 10, wherein the regulating temperature means is a thermoelectric cooler.

18. The fiber optic device of claim 10, wherein the control surface regulates the temperature of the fiber optic laser.

19. A temperature regulator for regulating temperature, comprising:

detecting means for detecting a temperature;

a comparator coupled to the detecting means for comparing the temperature to a temperature reference, wherein the temperature reference is indicative of a desired temperature, and wherein the comparator provides an output voltage signal;

a controller coupled to the comparator for receiving the output voltage signal, and for providing a first ratio signal to a first output port, and for providing a second ratio signal to a second output port, wherein the controller adjusts voltage levels of the first and second ratio signals depending upon the output voltage signal provided by the comparator;

a first synchronous rectifier coupled to the first output port of the controller for receiving the first ratio signal, and for providing an output signal in accordance with the first ratio signal;

a second synchronous rectifier coupled to the second output port of the controller for receiving the second ratio signal, and for providing an output signal in accordance with the second ratio signal;

a current monitor for measuring the output signals provided by each of the first synchronous rectifier and the second synchronous rectifier to generate a current monitor signal, wherein the controller additionally receives the current monitor signal and provides the first ratio signal and the second ratio signal in accordance therewith; and means for regulating temperature on a control surface, wherein the temperature regulating means receives the output signal from each of the first synchronous rectifier and the second synchronous rectifier and regulates the temperature in accordance with the output signal, wherein the first synchronous rectifier provides the output signal to the temperature regulating means and thereby decreases the temperature across the temperature regulating means in accordance with the output signal, and wherein the second synchronous rectifier provides the output signal to the temperature regulating means and thereby increases the temperature across the temperature regulating means in accordance with the output signal.

20. The temperature regulator of claim 19, wherein, when the temperature has increased above the desired temperature, the controller decreases the voltage level of the first ratio signal and increases the voltage level of the second ratio signal and, when the temperature has decreased below the desired temperature, the controller increases the voltage level of the first ratio signal and decreases the voltage level of the second ratio signal.

* * * * *